(12) United States Patent
Chia et al.

(10) Patent No.: US 11,764,188 B2
(45) Date of Patent: Sep. 19, 2023

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Meng-Huan Chia, Taichung (TW); Yih-Jenn Jiang, Taichung (TW); Chang-Fu Lin, Taichung (TW); Don-Son Jiang, Taichung (TW)

(73) Assignee: SILICONWARE PRECISION INDUSTRIES CO., LTD.

( * ) Notice: Subject to any disclaimer, the term of this patent is extended or adjusted under 35 U.S.C. 154(b) by 127 days.

(21) Appl. No.: 17/411,228

(22) Filed: Aug. 25, 2021

(65) Prior Publication Data

US 2023/0015721 A1 Jan. 19, 2023

(30) Foreign Application Priority Data

Jul. 14, 2021 (TW) .................................. 110125877

(51) Int. Cl.
*H01L 25/065* (2023.01)
*H01L 25/16* (2023.01)
*H01L 25/00* (2006.01)

(52) U.S. Cl.
CPC ........ *H01L 25/0657* (2013.01); *H01L 25/162* (2013.01); *H01L 25/50* (2013.01); *H01L 2225/06517* (2013.01); *H01L 2225/06548* (2013.01); *H01L 2225/06572* (2013.01); *H01L 2225/06589* (2013.01)

(58) Field of Classification Search
CPC .... H01L 25/0657; H01L 25/162; H01L 25/50
See application file for complete search history.

(56) References Cited

U.S. PATENT DOCUMENTS

| | | | |
|---|---|---|---|
| 11,694,940 B1* | 7/2023 | Mathuriya | H10B 53/40 257/295 |
| 11,694,994 B2* | 7/2023 | Kim | H01L 24/16 257/686 |
| 2022/0084963 A1* | 3/2022 | Wei | H01L 23/66 |
| 2023/0069031 A1* | 3/2023 | Wu | H01L 25/0652 |
| 2023/0187422 A1* | 6/2023 | Lin | H01L 21/568 257/668 |

* cited by examiner

*Primary Examiner* — Thao P Le
(74) *Attorney, Agent, or Firm* — KELLY & KELLEY, LLP

(57) ABSTRACT

An electronic package is provided, in which a first electronic element and a second electronic element are disposed on a first side of a circuit structure and a second side of the circuit structure, respectively, where a first metal layer is formed between the first side of the circuit structure and the first electronic element, a second metal layer is formed on a surface of the second electronic element, and at least one thermally conductive pillar is disposed on the second side of the circuit structure and extends into the circuit structure to thermally conduct the first metal layer and the second metal layer. Therefore, through the thermally conductive pillar, heat generated during operations of the first electronic element and the second electronic element can be quickly dissipated to an external environment and would not accumulate.

10 Claims, 4 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package having a heat dissipation mechanism and manufacturing method thereof.

2. Description of Related Art

In order to ensure and continue the miniaturization and multi-function of electronic products and communication equipment, semiconductor packages need to be miniaturized to facilitate multi-pin connections and have high functionality. For example, in the advanced packaging process, common packaging processes such as 2.5D packaging process and fan-out distribution with embedded bridge element (FO-EB) manufacturing process are used, where the FO-EB manufacturing process has a lower cost and more material suppliers relative to the 2.5D packaging process.

FIG. 1-1 and FIG. 1-2 are schematic views of a conventional FO-EB semiconductor package 1. As shown in FIG. 1-1 and FIG. 1-2, in the semiconductor package 1, a plurality of semiconductor chips 11, 12 are flip-chip disposed (via conductive bumps 13) on a substrate structure 10 having a dielectric layer 100 and a circuit layer 101. Then, the plurality of semiconductor chips 11, 12 are encapsulated by a packaging layer 18.

In the conventional semiconductor package 1, the substrate structure 10 is disposed on a circuit board 1a via a plurality of solder balls 17.

However, heat generated during operations of the semiconductor chips 11, 12 needs to conduct through an encapsulant of the packaging layer 18 so as to be conducted onto the substrate structure 10 (or conduct through the dielectric layer 100 of the substrate structure 10 to an external environment). As such, the semiconductor chips 11, 12 are prone to heat accumulation and cannot meet heat dissipation requirements.

Therefore, how to overcome the above-described drawbacks of the prior art has become an urgent issue in the art.

SUMMARY

In view of the above-described drawbacks of the prior art, the present disclosure provides an electronic package, which comprises: a circuit structure having a first side and a second side opposing the first side, with a first metal layer formed on the first side; a first electronic element disposed on the first side of the circuit structure and in contact and bonded with the first metal layer; a second electronic element disposed on the second side of the circuit structure; a second metal layer formed on a surface of the second electronic element; and at least one thermally conductive pillar disposed on the second side of the circuit structure and extending into the circuit structure to thermally conduct the first metal layer and the second metal layer.

The present disclosure further provides a method for manufacturing an electronic package, which comprises: providing a first electronic element and a circuit structure, wherein the circuit structure has a first side and a second side opposing the first side, wherein the first electronic element is disposed on the first side of the circuit structure, with a first metal layer formed between the first side of the circuit structure and the first electronic element, and wherein the first electronic element is in contact and bonded with the first metal layer; disposing a second electronic element and at least one thermally conductive pillar on the second side of the circuit structure, wherein the thermally conductive pillar extends into the circuit structure; and forming a second metal layer on a surface of the second electronic element, wherein the thermally conductive pillar thermally conducts the first metal layer and the second metal layer.

In the above-described electronic package and method, the present disclosure further comprises encapsulating the first electronic element via an encapsulation layer.

In the above-described electronic package and method, the present disclosure further comprises encapsulating the second electronic element via a packaging layer.

In the above-described electronic package and method, the present disclosure further comprises carrying the first electronic element via a carrier structure, wherein the first electronic element is electrically connected to the carrier structure. For example, a plurality of conductive pillars are disposed on the carrier structure, wherein the plurality of conductive pillars are electrically connected to the carrier structure and the circuit structure.

Therefore, through the at least one thermally conductive pillar thermally conducting the first metal layer and the second metal layer, heat of the first electronic element and the second electronic element can be conducted out concurrently. Compared to the prior art, the heat generated during operations of the first electronic element and the second electronic element of the present disclosure can be quickly dissipated to an external environment and would not accumulate, thereby meeting heat dissipation requirements.

BRIEF DESCRIPTION OF THE DRAWINGS

FIG. 1-2 is a schematic upper plane view of FIG. 1-1.

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "on," "first," "second," "a," etc., are merely for illustrative purposes and should not be construed to limit the scope of the present disclosure.

FIG. 2A to FIG. 2D are schematic cross-sectional views illustrating a method for manufacturing an electronic package 2 according to the present disclosure.

Figure 1:
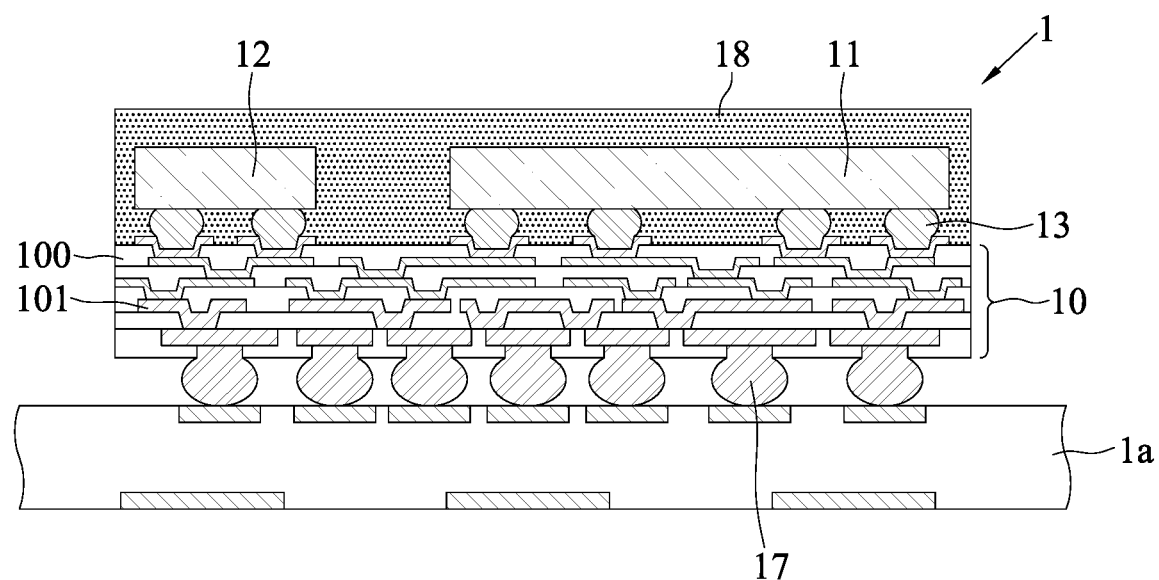
FIG. 1-1 is a schematic cross-sectional view of a conventional semiconductor package.
Figures 1, 2:
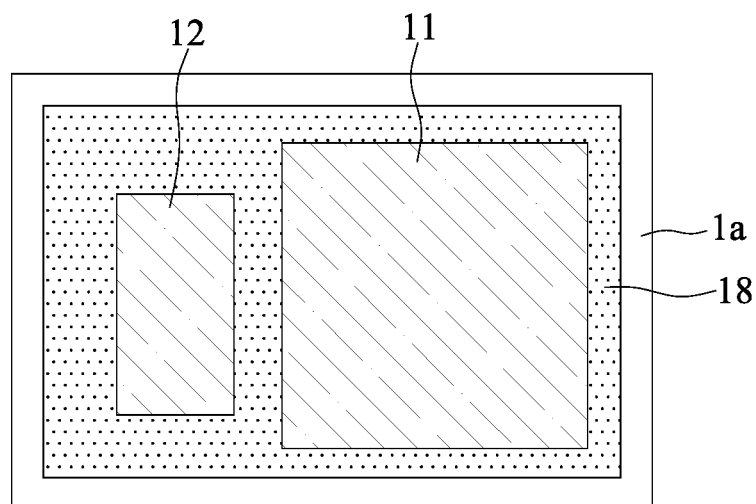
Figure 2A:
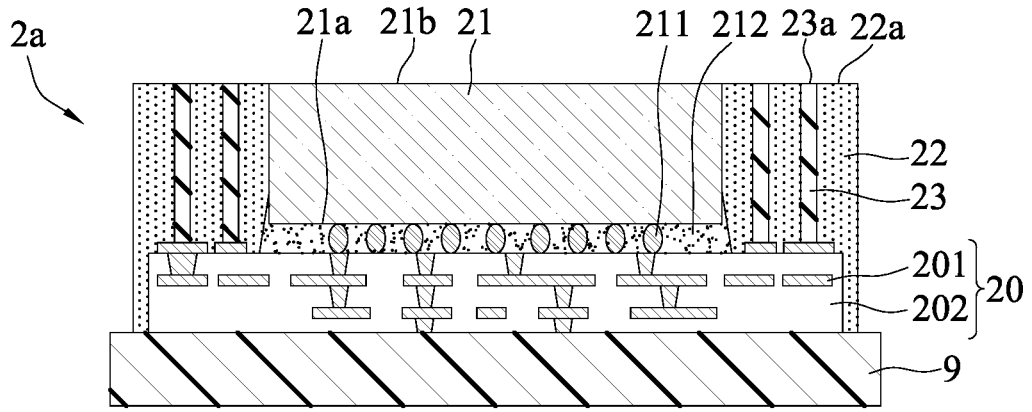
FIG. 2A to FIG. 2D are schematic cross-sectional views illustrating a method for manufacturing an electronic package according to the present disclosure.

As shown in FIG. 2A, a packaging module 2a is provided and includes a carrier structure 20, at least one first electronic element 21 disposed on the carrier structure 20, an encapsulation layer 22 encapsulating the first electronic element 21 and a plurality of conductive pillars 23 (e.g., electrically conductive pillars) embedded in the encapsulation layer 22.

The carrier structure 20 is, for example, a package substrate with a core layer and circuit structures, a package substrate with coreless circuit structures, a through silicon interposer (TSI) with through silicon vias (TSVs) or another type of board that includes at least one insulating layer 200 and at least one circuit layer 201 bonded to the insulating layer 200, such as at least one fan-out redistribution layer (RDL). It can be understood that the carrier structure 20 can also be other types of substrates that carry chips, such as a lead frame, a wafer, a board with metal routing, and the present disclosure is not limited as such.

In an embedment, the carrier structure 20 is disposed on a support board 9, and the support board 9 is a board made of a semiconductor material (e.g., silicon or glass).

The first electronic element 21 is an active element (such as a semiconductor chip) and has an active surface 21a and a non-active surface 21b opposing the active surface 21a. A plurality of electrode pads are formed on the active surface 21a, such that the first electronic element 21 is disposed on the carrier structure 20 and electrically connected to the circuit layer 201 in a flip-chip manner via a plurality of conductive bumps 211 (e.g., solder materials, metal pillars, etc.), and the conductive bumps 211 are encapsulated by an insulating material 212 such as an underfill or a non-conductive film (NCF). Alternatively, the first electronic element 21 is electrically connected to the circuit layer 201 of the carrier structure 20 via a plurality of bonding wires (not shown) in a wire-bonding manner. As yet another alternative, the first electronic element 21 can be directly in contact with the circuit layer 201 of the carrier structure 20. However, the ways in which the first electronic element 21 can be electrically connected to the carrier structure 20 are not limited to those described above.

The encapsulation layer 22 is made of an insulating material such as polyimide (PI), a dry film, an encapsulant of an epoxy resin or a molding compound.

In an embodiment, a planarization process is performed, such that a surface 22a of the encapsulation layer 22 is flush with the non-active surface 21b of the first electronic element 21 and end surfaces 23a of the conductive pillars 23, so that the non-active surface 21b of the first electronic element 21 and the end surfaces 23a of the conductive pillars 23 are exposed from the surface 22a of the encapsulation layer 22. For example, in the planarization process, a portion of the first electronic element 21, a portion of the conductive pillars 23 and a portion of the encapsulation layer 22 are removed in a polishing manner.

The conductive pillars 23 are formed on the carrier structure 20 and electrically connected to the circuit layer 201. The conductive pillars 23 are made of a metal material (e.g., copper) or a solder material.

Figure 2B:
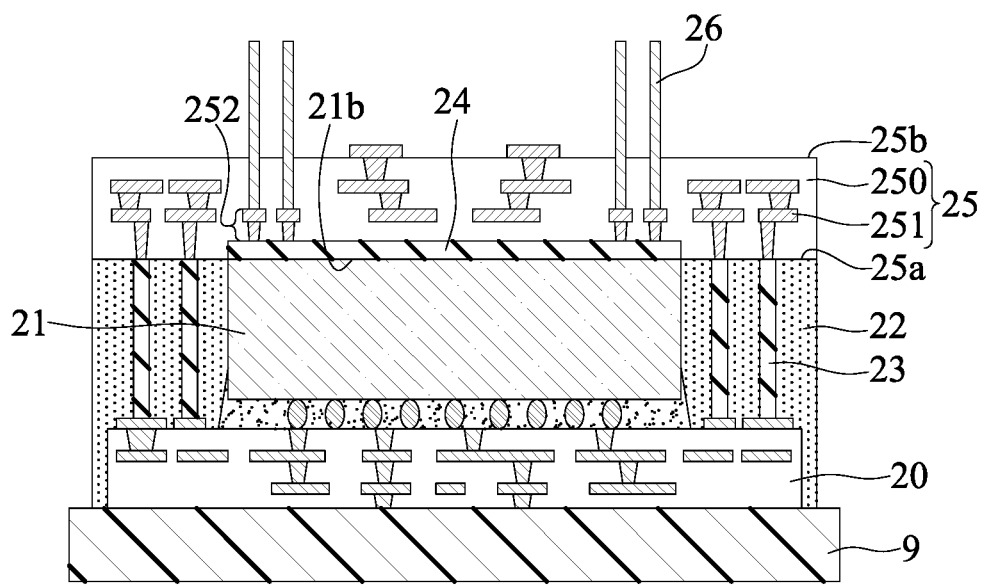

As shown in FIG. 2B, a first metal layer 24 is in contact with and bonded on the non-active surface 21b of the first electronic element 21, and a circuit structure 25 is formed on the encapsulation layer 22 and the first metal layer 24. Further, at least one thermally conductive pillar 26 in communication with the first metal layer 24 is formed in the circuit structure 25, and the thermally conductive pillar 26 protrudes from the inside of the circuit structure 25 to the outside of the circuit structure 25.

In an embodiment, the circuit structure 25 includes a plurality of dielectric layers 250 and a plurality of redistribution layers 251 (RDLs 251) disposed on the dielectric layers 250. The outermost layer of each of the dielectric layers 250 can serve as a solder mask, and the outermost layer of each of the redistribution layers 251 is exposed from the solder mask to serve as a conductive pad. For example, the redistribution layers 251 are made of copper, and the dielectric layers 250 are made of a dielectric material (e.g., polybenzoxazole [PBO], polyimide, prepreg [PP], etc.) or a solder-resist material (e.g., a solder mask, etc.).

Moreover, at least one thermally conductive circuit 252 in contact with the first metal layer 24 is arranged in the circuit structure 25, and the thermally conductive pillar 26 is extended into the dielectric layers 250 of the circuit structure 25 and in contact with the thermally conductive circuit 252. For example, the thermally conductive circuit 252 and the redistribution layers 251 adopt the same manufacturing process, such that the thermally conductive circuit 252 can be manufactured with the redistribution layers 251.

Furthermore, the circuit structure 25 has a first side 25a and a second side 25b opposing the first side 25a, and the first electronic element 21, the conductive pillars 23 and the first metal layer 24 are arranged with respect to the first side 25a of the circuit structure 25, where the redistribution layers 251 are electrically connected to the conductive pillars 23.

Figure 2C:
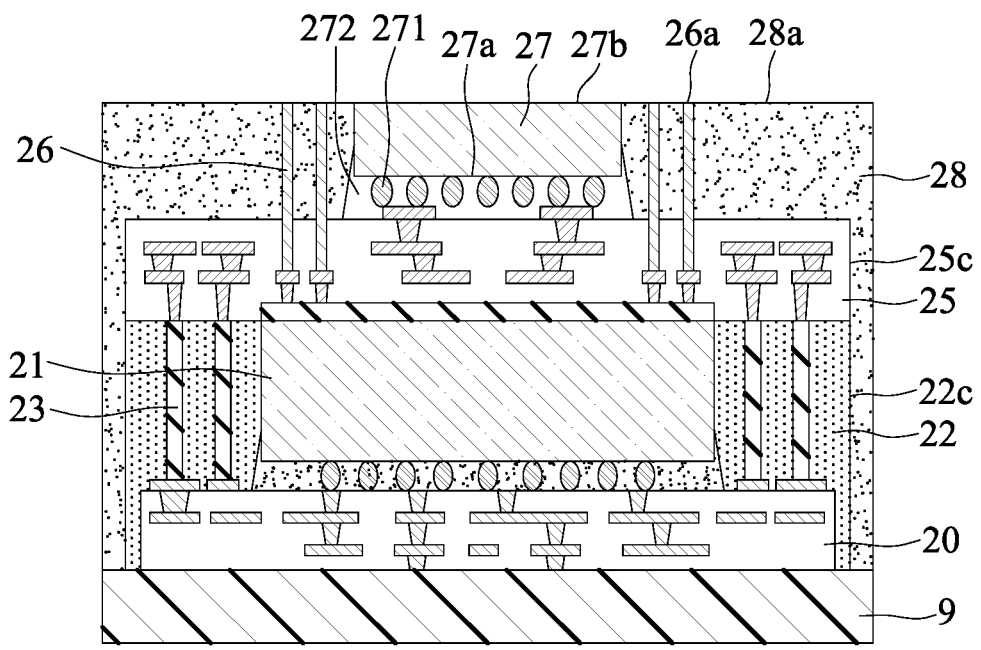

As shown in FIG. 2C, at least one second electronic element 27 is disposed on the circuit structure 25, and a packaging layer 28 encapsulates the second electronic element 27, the thermally conductive pillar 26, a side surface 25c of the circuit structure 25 and a side surface 22c of the encapsulation layer 22.

In an embodiment, the second electronic element 27 is an active element, a passive element, or a combination of the active element and the passive element. The active element can be a semiconductor chip, and the passive element can be a resistor, a capacitor, or an inductor, but the present disclosure is not limited as such. For example, the second electronic element 27 has an active surface 27a and a non-active surface 27b opposing the active surface 27a. A plurality of electrode pads are formed on the active surface 27a, such that the second electronic element 27 is disposed on the redistribution layers 251 of the circuit structure 25 and electrically connected to the redistribution layers 251 in a flip-chip manner via a plurality of conductive bumps 271 (e.g., solder materials, metal pillars, etc.), and the conductive bumps 271 are encapsulated by an insulating material 272 such as an underfill or a non-conductive film (NCF). Alternatively, the second electronic element 27 is electrically connected to the redistribution layers 251 of the circuit structure 25 via a plurality of bonding wires (not shown) in a wire-bonding manner. As yet another alternative, the second electronic element 27 can be directly in contact with the redistribution layers 251 of the circuit structure 25. However, the ways in which the second electronic element 27 can be electrically connected to the circuit structure 25 are not limited to those described above.

Moreover, the packaging layer 28 is made of an insulating material such as polyimide, a dry film, an encapsulant of an epoxy resin or a molding compound. The packaging layer 28 can be formed on the circuit structure 25 in a manner of lamination or molding. It can be understood that the encapsulation layer 22 and the packaging layer 28 can be formed of the same material or different materials.

Furthermore, a planarization process is performed, such that a surface 28a of the packaging layer 28 is flush with the non-active surface 27b of the second electronic element 27 and an end surface 26a of the thermally conductive pillar 26, so that the non-active surface 27b of the second electronic element 27 and the end surface 26a of the thermally conductive pillar 26 are exposed from the surface 28a of the packaging layer 28. For example, in the planarization process, a portion of the second electronic element 27, a portion of the thermally conductive pillar 26 and a portion of the packaging layer 28 are removed in a polishing manner.

Figure 2D:
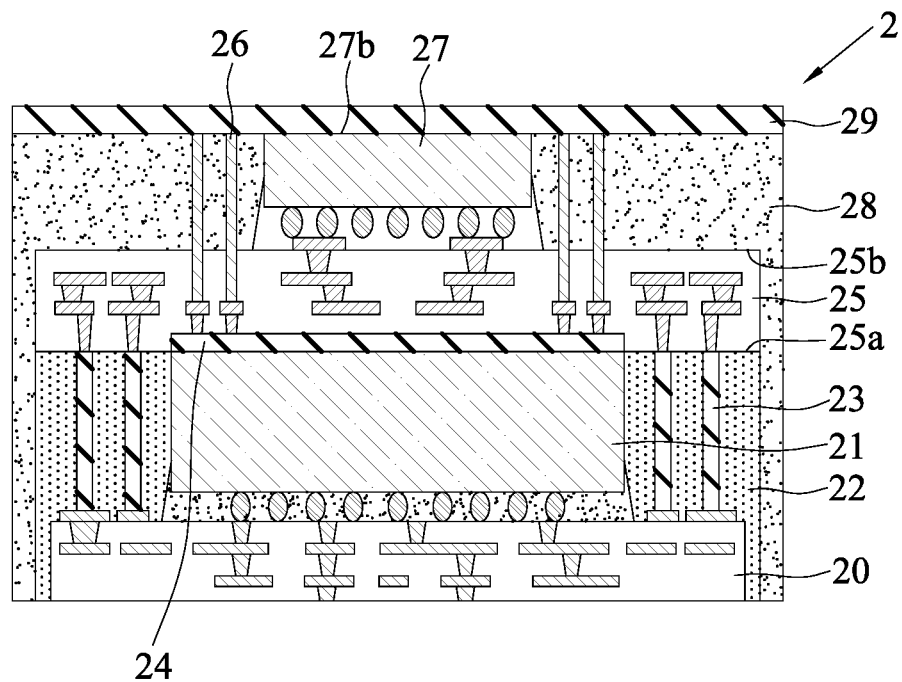

As shown in FIG. 2D, a second metal layer 29 is formed on the non-active surface 27b of the second electronic element 27 and the packaging layer 28, and the second metal layer 29 is in contact and bonded with the thermally conductive pillar 26.

In an embodiment, the second metal layer 29 and the first metal layer 24 can be formed of the same material or different materials. The first metal layer 24, the thermally conductive circuit 252, the thermally conductive pillar 26 and the second metal layer 29 serve as heat dissipation paths of the first electronic element 21 and the second electronic element 22.

Figure 3:
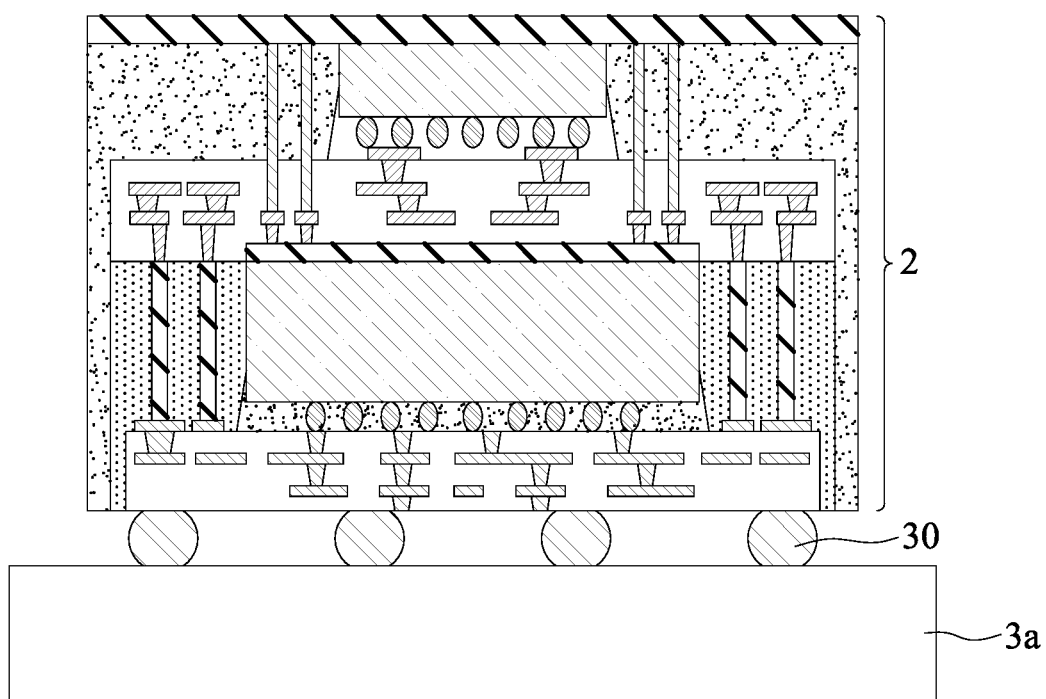
FIG. 3 is a schematic cross-sectional view showing a subsequent manufacturing process of FIG. 2D.

In a subsequent manufacturing process, the support board 9 is removed, thereby forming the electronic package 2 of the present disclosure. As shown in FIG. 3, the carrier structure 20 of the electronic package 2 can be disposed on a circuit board 3a via a plurality of conductive elements 30.

Therefore, in the manufacturing method of the electronic package 2 according to the present disclosure, by forming the thermally conductive pillar 26 between the first metal layer 24 and the second metal layer 29, heat of the first electronic element 21 and the second electronic element 22 can be conducted out concurrently. Compared to the prior art, the heat generated during operations of the first electronic element 21 and the second electronic element 27 of the electronic package 2 of the present disclosure can be quickly dissipated to an external environment and would not accumulate, thereby meeting heat dissipation requirements.

The present disclosure also provides an electronic package 2, which includes a circuit structure 25, a first electronic element 21, a second electronic element 27 and at least one thermally conductive pillar 26.

The circuit structure 25 has a first side 25a and a second side 25b opposing the first side 25a, and a first metal layer 24 is formed on the first side 25a.

The first electronic element 21 is disposed on the first side 25a of the circuit structure 25 and is in contact and bonded with the first metal layer 24.

The second electronic element 27 is disposed on the second side 25b of the circuit structure 25, and a second metal layer 29 is disposed on a surface of the second electronic element 27 (a non-active surface 27b).

The thermally conductive pillar 26 is disposed on the second side 25b of the circuit structure 25 and extends into the circuit structure 25 to thermally conduct the first metal layer 24 and the second metal layer 29.

In an embodiment, the electronic package 2 further includes an encapsulation layer 22 encapsulating the first electronic element 21.

In an embodiment, the electronic package 2 further includes a packaging layer 28 encapsulating the second electronic element 27.

In an embodiment, the electronic package 2 further includes a carrier structure 20 carrying the first electronic element 21, and the first electronic element 21 is electrically connected to the carrier structure 20. For example, a plurality of conductive pillars 23 are disposed on the carrier structure 20, such that the conductive pillars 23 are electrically connected to the carrier structure 20 and the circuit structure 25.

In summary, in the electronic package and manufacturing method thereof of the present disclosure, through the thermally conductive pillar thermally conducting the first metal layer and the second metal layer, heat of the first electronic element and the second electronic element can be conducted out concurrently. Therefore, the heat generated during operations of the first electronic element and the second electronic element of the present disclosure can be quickly dissipated to an external environment and would not accumulate, thereby meeting heat dissipation requirements.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a circuit structure having a first side and a second side opposing the first side, with a first metal layer formed on the first side;
    a first electronic element disposed on the first side of the circuit structure and in contact and bonded with the first metal layer;
    a second electronic element disposed on the second side of the circuit structure;
    a second metal layer formed on a surface of the second electronic element; and
    at least one thermally conductive pillar disposed on the second side of the circuit structure and extending into the circuit structure to thermally conduct the first metal layer and the second metal layer.

2. The electronic package of claim 1, further comprising an encapsulation layer encapsulating the first electronic element.

3. The electronic package of claim 1, further comprising a packaging layer encapsulating the second electronic element.

4. The electronic package of claim 1, further comprising a carrier structure carrying the first electronic element, wherein the first electronic element is electrically connected to the carrier structure.

5. The electronic package of claim 4, further comprising a plurality of conductive pillars disposed on the carrier structure, wherein the plurality of conductive pillars are electrically connected to the carrier structure and the circuit structure.

6. A method for manufacturing an electronic package, comprising:
    providing a first electronic element and a circuit structure, wherein the circuit structure has a first side and a second side opposing the first side, wherein the first electronic element is disposed on the first side of the circuit structure, with a first metal layer formed between the first side of the circuit structure and the first electronic element, and wherein the first electronic element is in contact and bonded with the first metal layer;
    disposing a second electronic element and at least one thermally conductive pillar on the second side of the circuit structure, wherein the thermally conductive pillar extends into the circuit structure; and
    forming a second metal layer on a surface of the second electronic element, wherein the thermally conductive pillar thermally conducts the first metal layer and the second metal layer.

7. The method of claim 6, further comprising encapsulating the first electronic element via an encapsulation layer.

8. The method of claim 6, further comprising encapsulating the second electronic element via a packaging layer.

9. The method of claim 6, further comprising carrying the first electronic element via a carrier structure, wherein the first electronic element is electrically connected to the carrier structure.

10. The method of claim 9, further comprising disposing a plurality of conductive pillars on the carrier structure, wherein the plurality of conductive pillars are electrically connected to the carrier structure and the circuit structure.

\* \* \* \* \*